(12) United States Patent
Miyake et al.

(10) Patent No.: US 6,181,268 B1
(45) Date of Patent: Jan. 30, 2001

(54) SUCCESSIVE APPROXIMATION A/D CONVERTER IMPROVING TRACKING ABILITY OF DIGITAL SIGNAL TO ANALOG SIGNAL

(75) Inventors: Takashi Miyake; Yoshikazu Sato, both of Tokyo (JP)

(73) Assignees: Mitsubishi Electric Semiconductor System Corporation; Mitsubishi Denki Kabushiki Kaisha, both of Tokyo (JP)

( * ) Notice: Under 35 U.S.C. 154(b), the term of this patent shall be extended for 0 days.

(21) Appl. No.: 09/287,567

(22) Filed: Apr. 6, 1999

(30) Foreign Application Priority Data

Oct. 21, 1998 (JP) .................................................. 10-299921

(51) Int. Cl.[7] ...................................................... H03M 1/38
(52) U.S. Cl. ............................................ 341/161; 341/163
(58) Field of Search .................................. 341/155, 161, 341/162, 163, 164, 165

(56) References Cited

U.S. PATENT DOCUMENTS 5,296,856 * 3/1994 Mantong ............................... 341/139
5,579,005 * 11/1996 Moroni ................................. 341/155
5,736,953 * 4/1998 Yamaguchi ........................... 341/163
6,075,478 * 6/2000 Abe ....................................... 341/155

FOREIGN PATENT DOCUMENTS 1-046320 * 2/1989 (JP) .
4-340814 * 11/1992 (JP) .
5-37376 2/1993 (JP) .

* cited by examiner

Primary Examiner—Howard L. Williams
(74) Attorney, Agent, or Firm—Burns, Doane, Swecker & Mathis, LLP

(57) ABSTRACT

A successive approximation A/D converter which converts an analog signal to a digital signal by carrying out successive A/D conversions of the analog signal. It carries out, for a least significant bit of the digital signal, A/D conversion of the analog signal using a reference voltage corresponding to a previous digital signal obtained as a result of a previous A/D conversion, increments a current digital signal, which is obtained as a result of the latest A/D conversion, when the least significant bit of the current digital signal is "1", and decrements the current digital signal when the least significant bit is "0". This makes it possible to solve a problem of a conventional successive approximation A/D converter in that the tracking ability of the digital signal to variations of the analog signal is degraded because of the long update period involved in the increasing number of the bits of the A/D converter, if full bit conversion is carried out.

16 Claims, 7 Drawing Sheets

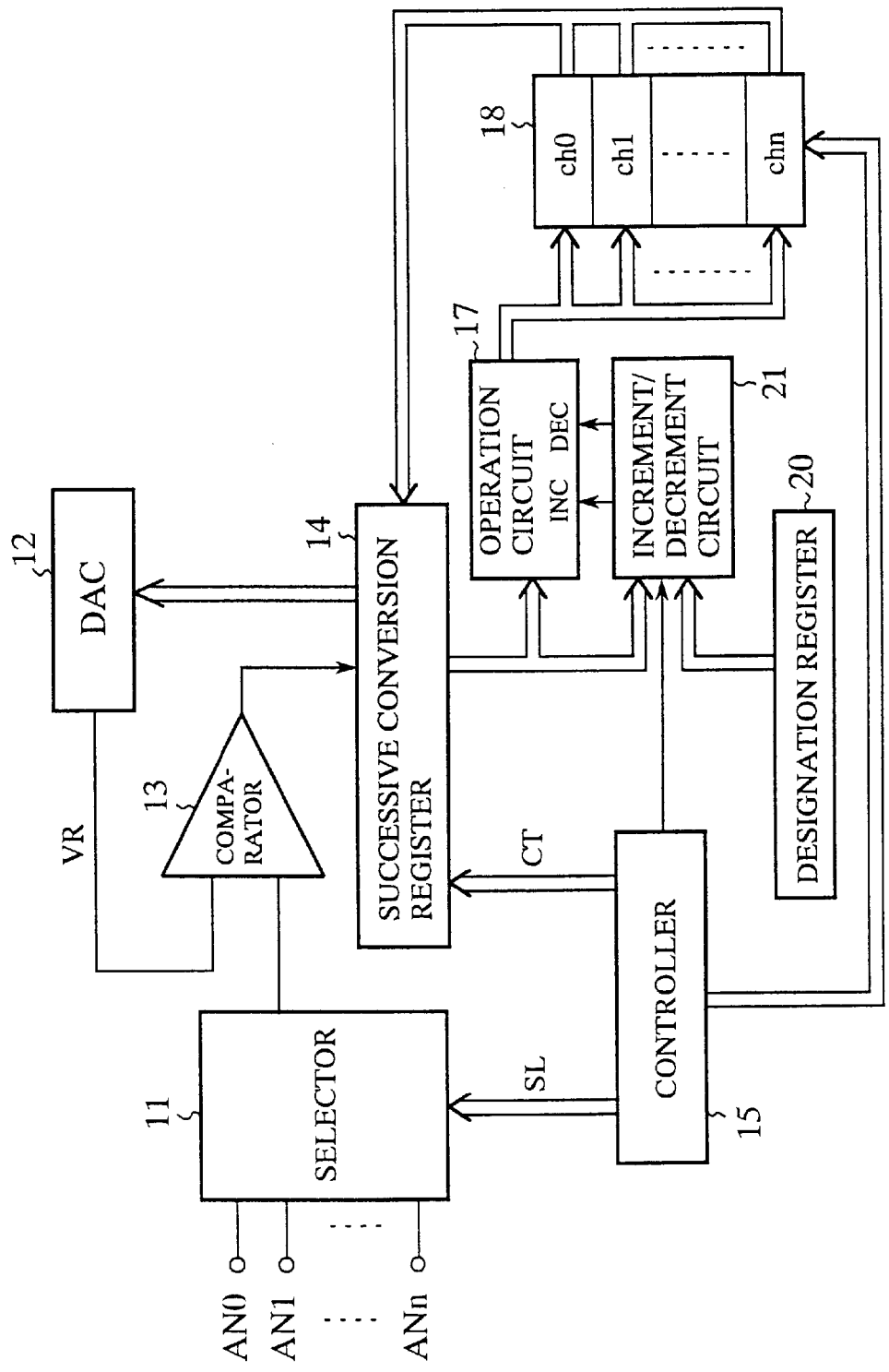

US 6,181,268 B1

SUCCESSIVE APPROXIMATION A/D CONVERTER IMPROVING TRACKING ABILITY OF DIGITAL SIGNAL TO ANALOG SIGNAL

BACKGROUND OF THE INVENTION

1. Field of the Invention

The present invention relates to a successive approximation A/D (analog-to-digital) converter for carrying out analog-to-digital conversion of a plurality of analog signals in a continuous scanning mode.

2. Description of Related Art

FIG. 8 is a block diagram showing a conventional A/D converter, in which the reference numeral 1 designates a selector for sequentially selecting in response to a select signal output from a controller 5 one of analog signals to be A/D converted; 2 designates a DAC (digital-to-analog converter) for generating a reference voltage in accordance with a value stored in a successive conversion register 4; 3 designates a comparator for comparing the reference voltage generated by the DAC 2 with the voltage of the analog signal selected by the selector 1; 4 designates the successive conversion register for storing a result of the comparison by the comparator 3; 5 designates the controller for producing the select signal and a control signal; and 6 designates a conversion result storing register for storing results of the A/D conversion.

Next, the operation of the conventional A/D converter will be described.

The A/D converter of FIG. 8 scans n analog signals sequentially so that they are converted into digital signals in order. For example, to achieve the A/D conversion of an analog signal AN0, the controller 5 supplies the selector 1 with the select signal instructing the A/D conversion of the analog signal AN0, and the selector 1 selects the analog signal AN0 in response to the select signal.

When supplying the selector 1 with the select signal, the controller 5 sets the most significant bit of the successive conversion register 4 to "1" (it corresponds to bit 7 in an 8-bit A/D converter, for example. The following description will be provided taking an 8-bit A/D converter as an example for convenience sake), and sets the remaining bits (from bit 6 to bit 0) to "0".

The DAC 2 generates, after the controller 5 sets the value of the successive conversion register 4, the reference voltage in accordance with the value stored in the successive conversion register 4, and the comparator 3 compares the reference voltage with the voltage of the analog signal selected by the selector 1.

If the voltage of the analog signal is equal to or greater than the reference voltage (voltage of the analog signal≧reference voltage), the comparator 3 sets the most significant bit of the successive conversion register 4, the bit 7 to "1". In contrast, if the voltage of the analog signal is less than the reference voltage (voltage of the analog signal<reference voltage), it sets the most significant bit of the successive conversion register 4, the bit 7 to "0".

After completing the conversion of the bit 7, the most significant bit, the controller 5 changes the bit 6 of the successive conversion register 4 from "0" to "1" (thus, the bit 7 is set at the conversion result, the bit 6 is set at "1" and the remaining bits 5–0 are set at "0"). Then, in the same manner as described above, the DAC 2 generates the reference voltage in accordance with the value stored in the successive conversion register 4, and the comparator 3 compares the reference voltage with the voltage of the analog signal selected by the selector 1.

If the voltage of the analog signal is equal to or greater than the reference voltage (voltage of the analog signal≧reference voltage), the comparator 3 sets the bit 6 to "1". On the contrary, if the voltage of the analog signal is less than the reference voltage (voltage of the analog signal<reference voltage), it sets the bit 6 to "0".

After completing the conversion of the bit 6 in this way, the converter carries out the conversion successively of the bits 5–0 in the same manner as described above. When the conversion of the bits 5–0 is completed, the A/D conversion of the analog signal AN0 is finished, and the value stored in the successive conversion register 4 is stored in the conversion result storing register 6.

Completing the A/D conversion of the analog signal AN0, the converter starts the conversion of the next analog signal AN1 as illustrated in FIG. 9. Thus, when there are n analog signals, the update period of each analog signal becomes as follows:

Update period=full bit conversion period×number of the analog signals=conversion period per bit×number of bits to be converted×number of analog signals Besides the foregoing conventional example, Japanese patent application laid-open No. 5-14197/1993 discloses a technique, in which the converter compares the voltage of the current analog signal with the voltage of the previous analog signal, and carries out full bit A/D conversion only when they disagree with skipping the A/D conversion when they agree, thereby trying to reduce the update period of the analog signals.

With the arrangement as described above, the conventional A/D converter can convert the analog signal into the digital signal through the full bit conversion (for example, it carries out eight conversion processings in the 8-bit A/D converter). The conventional A/D converter, however, has a problem in that the update period of the analog signals will increase with the number of the bits of the A/D converter because of an increase in the number of conversions, thereby degrading tracking ability of the digital signals to the variations of the analog signals.

SUMMARY OF THE INVENTION

The present invention is implemented to solve the foregoing problem. It is therefore an object of the present invention to provide an A/D converter with high tracking ability of the digital signals to the variations of the analog signals.

According to a first aspect of the present invention, there is provided a successive approximation A/D converter for successively converting an analog signal to an N-bit digital signal on a bit by bit basis, where N is a positive integer, the successive approximation A/D converter comprising: converting means for performing, at least for lowest M bits of the N-bit digital signal, where M is a positive integer less than N, successive A/D conversions of the analog signal by comparing a voltage of the analog signal with a reference voltage, and by updating, using a result of the comparison, a previous N-bit digital signal obtained as a result of a previous A/D conversion, thereby outputting a current N-bit digital signal; generating means for generating the reference voltage corresponding to the previous N-bit digital signal; and operation means for incrementing the current N-bit digital signal output from the converting means if the lowest M bits of the current N-bit digital signal are all "1", and for decrementing the current N-bit digital signal output from the converting means if the lowest M bits of the current N-bit digital signal are all "0".

Here, M may be one, and the converting means may compare the voltage of the analog signal with the reference voltage, and update the least significant bit of the previous N-bit digital signal to "1" when the voltage of the analog signal is equal to or greater than the reference voltage, and to "0" when the voltage of the analog signal is less than the reference voltage, thereby outputting the current N-bit digital signal, and the operation means may increment, when the converting means converts the least significant bit to "1", the current N-bit digital signal output from the converting means, and decrement, when the converting means converts the least significant bit to "0", the current N-bit digital signal output from the converting means.

The successive approximation A/D converter may further comprise designating means for specifying the integer M.

The converting means may perform, only in a first one of the successive A/D conversions by the converting means, the A/D conversion for entire N bits of the N-bit digital signal.

The successive approximation A/D converter may further comprise setting means for carrying out initial setting of the reference voltage when performing a first one of the successive A/D conversions by the converting means.

The successive approximation A/D converter may further comprise a selector for selecting from among a plurality of analog signals the analog signal to be supplied to the converting means, and a memory for storing a plurality of N-bit digital signals obtained by A/D converting the plurality of analog signals.

According to a second aspect of the present invention, there is provided a successive approximation A/D converter for successively converting an analog signal to an N-bit digital signal on a bit by bit basis, where N is a positive integer, the successive approximation A/D converter comprising: operation means for incrementing a previous N-bit digital signal obtained as a result of a previous A/D conversion of the analog signal if lowest M bits of the previous N-bit digital signal are all "1", where M is a positive integer less than N, and for decrementing the previous N-bit digital signal if the lowest M bits of the previous N-bit digital signal are all "0", thereby outputting a modified previous N bit digital signal; generating means for generating a reference voltage corresponding to the modified N-bit digital signal output from the operation means; and converting means for performing, at least for the lowest M bits of the N-bit digital signal, successive A/D conversions of the analog signal by comparing a voltage of the analog signal with the reference voltage, and for updating, using a result of the comparison, the modified previous N-bit digital signal output from the operation means.

Here, M may be one, and the operation means may increment the previous N-bit digital signal when a least significant bit of the previous N-bit digital signal is "1", and decrement the previous N-bit digital signal when the least significant bit is "0", thereby outputting the modified previous N-bit digital signal, and the converting means may compare the voltage of the analog signal with the reference voltage, and update the least significant bit of the modified previous N-bit digital signal output from the operation means to "1" when the voltage of the analog signal is equal to or greater than the reference voltage, and to "0" when the voltage of the analog signal is less than the reference voltage.

The successive approximation A/D converter may further comprise designating means for specifying the integer M.

The converting means may perform, only in a first one of the successive A/D conversions by the converting means, the A/D conversion for entire N bits of the N-bit digital signal.

The successive approximation A/D converter may further comprise setting means for carrying out initial setting of the reference voltage when performing a first one of the successive A/D conversions by the converting means.

The successive approximation A/D converter may further comprise a selector for selecting from among a plurality of analog signals the analog signal to be supplied to the converting means, and a memory for storing N-bit digital signals obtained by converting the plurality of analog signals.

According to a third aspect of the present invention, there is provided a successive approximation A/D converter for successively converting an analog signal to an N-bit digital signal on a bit by bit basis, where N is a positive integer, the successive approximation A/D converter comprising: generating means for generating a reference voltage corresponding to a previous N-bit digital signal obtained as a result of a previous A/D conversion of the analog signal; and converting means for carrying out successive A/D conversions of the analog signal by comparing a voltage of the analog signal with the reference voltage, by incrementing the previous N-bit digital signal when the voltage of the analog signal is equal to or greater than the reference voltage, and by decrementing the previous N-bit digital signal when the voltage of the analog signal is less than the reference voltage.

Here, the converting means may perform, only in a first one of the successive A/D conversions by the converting means, the A/D conversion for entire N bits of the N-bit digital signal.

The successive approximation A/D converter may further comprise setting means for carrying out initial setting of the reference voltage when performing a first one of the successive A/D conversions by the converting means.

The successive approximation A/D converter may further comprise a selector for selecting from among a plurality of analog signals the analog signal to be supplied to the converting means, and a memory for storing N-bit digital signals obtained by converting the plurality of analog signals.

BRIEF DESCRIPTION OF THE DRAWINGS

FIG. 4 is a block diagram showing an embodiment 3 of the A/D converter in accordance with the present invention;

DETAILED DESCRIPTION OF THE PREFERRED EMBODIMENTS

The invention will now be described with reference to the accompanying drawings.

Embodiment 1

Figure 1:
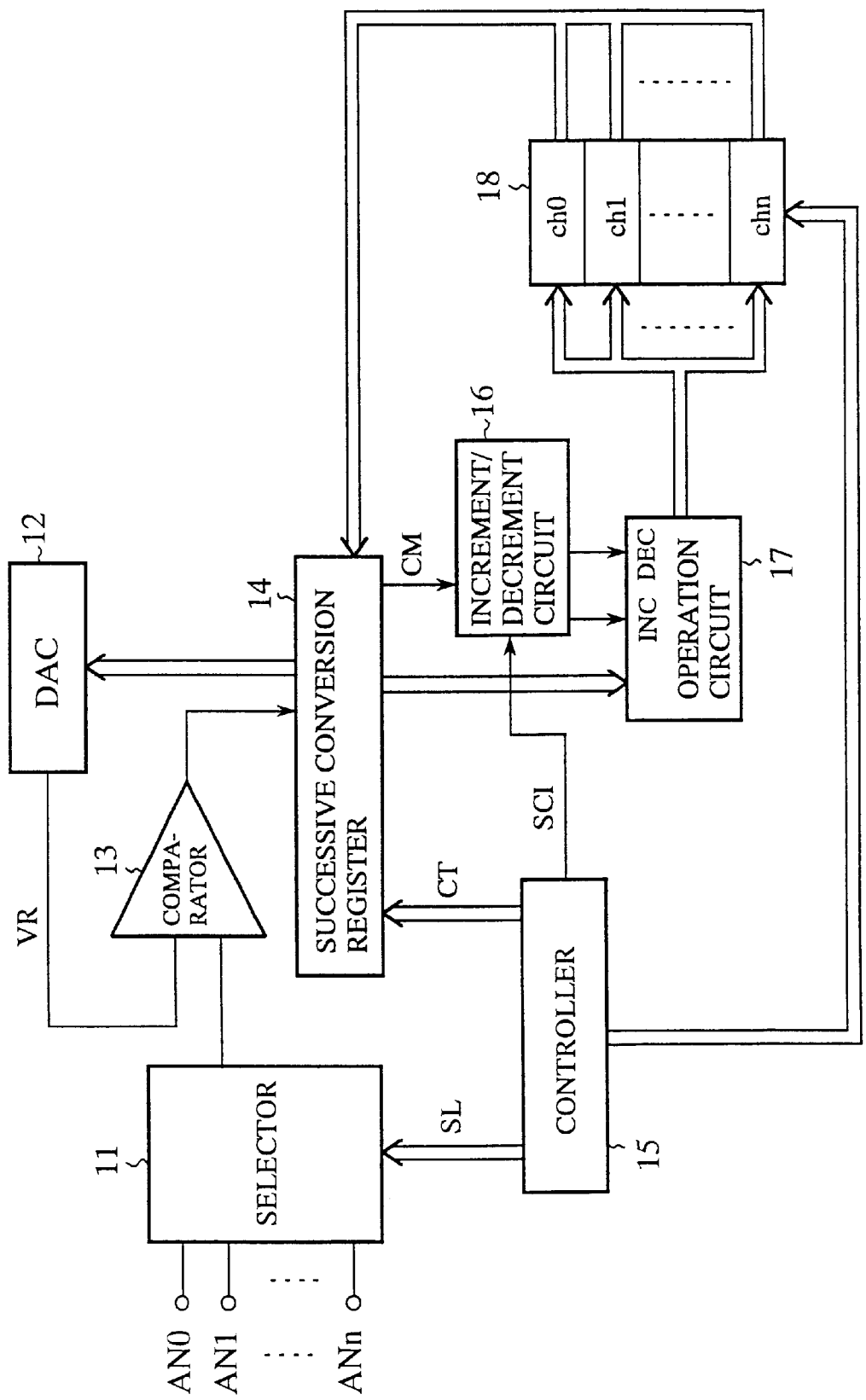
FIG. 1 is a block diagram showing an embodiment 1 of an A/D converter in accordance with the present invention.

FIG. 1 is a block diagram showing an embodiment 1 of an A/D converter in accordance with the present invention. In FIG. 1, the reference numeral 11 designates a selector for sequentially selecting in response to a select signal SL output from a controller 15 one of analog signals to be A/D converted; 12 designates a DAC (digital-to-analog converter) for generating a reference voltage VR in accordance with a value stored in a successive conversion register 14; 13 designates a comparator for comparing the reference voltage VR generated by the DAC 12 with the voltage of the analog signal selected by the selector 11; 14 designates the successive conversion register for storing results of the comparison by the comparator 13; and 15 designates the controller for producing the select signal SL and a control signal CT.

The reference numeral 16 designates an increment/decrement circuit for producing a command signal CM instructing to increment when "1" is stored in the least significant bit of the successive conversion register 14, and to decrement when "0" is stored in the least significant bit; 17 designates an operation circuit for reading the value stored in the successive conversion register 14 to increment or decrement the value in response to the command signal CM supplied from the increment/decrement circuit 16; and 18 designates a conversion result storing register for storing results of the A/D conversion.

Next, the operation of the present embodiment 1 will be described.

The A/D converter of FIG. 1 scans n analog signals sequentially so that they are converted into corresponding digital signals in order. For example, to achieve the A/D conversion of an analog signal AN0, the controller 15 supplies the selector 11 with the select signal SL instructing the A/D conversion of the analog signal AN0, and the selector 11 selects the analog signal AN0 in response to the select signal SL.

When supplying the selector 11 with the select signal SL, and if it is a first A/D conversion period (a first A/D conversion of the analog signal AN0), the controller 15 sets as in the conventional converter the most significant bit of the successive conversion register 14 to "1" (it corresponds to bit 7 in an 8-bit A/D converter, for example. The following description will be provided taking an 8-bit A/D converter as an example for convenience sake), and sets the remaining bits (from bit 6 to bit 0) to "0".

When the controller 15 sets the value in the successive conversion register 14, the DAC 2 generates the reference voltage VR in accordance with the value stored in the successive conversion register 14, and the comparator 13 compares the reference voltage VR with the voltage of the analog signal selected by the selector 11.

If the voltage of the analog signal is equal to or greater than the reference voltage VR (voltage of the analog signal $\geq$ reference voltage VR), the comparator 13 sets the most significant bit of the successive conversion register 14, the bit 7 to "1". In contrast, if the voltage of the analog signal is less than the reference voltage VR (voltage of the analog signal<reference voltage VR), it sets the most significant bit of the successive conversion register 14, the bit 7 to "0".

After completing the conversion of the bit 7, the most significant bit, the controller 15 changes the bit 6 of the successive conversion register 14 from "0" to "1" (thus, the bit 7 is set at the conversion result, the bit 6 is set at "1" and the remaining bits 5–0 are set at "0"). Then, in the same manner as described above, the DAC 12 generates the reference voltage VR in accordance with the value stored in the successive conversion register 14, and the comparator 13 compares the reference voltage VR with the voltage of the analog signal selected by the selector 11.

If the voltage of the analog signal is equal to or greater than the reference voltage VR (voltage of the analog signal $\geq$ reference voltage VR), the comparator 13 sets the bit 6 to "1". In contrast, if the voltage of the analog signal is less than the reference voltage VR (voltage of the analog signal<reference voltage VR), it sets the bit 6 to "0".

After completing the conversion of the bit 6 in this way, the converter carries out the conversion of the bits 5–0 in the same manner as described above. When the conversion of the bits 5–0 is completed, the A/D conversion of the analog signal AN0 is finished, and the value stored in the successive conversion register 14 is stored in the conversion result storing register 18.

Thus, in the first period of the A/D conversion, the controller 15 outputs a scanning cycle identification signal SCI indicating the first A/D conversion period so that the increment/decrement circuit 16 inactivates the command signal CM to increment or decrement, and the operation circuit 17 stores the value stored in the successive conversion register 14 into the conversion result storing register 18 without change.

Completing the A/D conversion of the analog signal AN0, the converter carries out the A/D conversion of the analog signals AN1-Ann sequentially. After completing the first period of the A/D conversion in this way, the second period of the A/D conversion is started. The controller 15 has the successive conversion register 14 load one of the previous A/D conversion results (A/D conversion results of the first period) which is stored in the conversion result storing register 18.

After the successive conversion register 14 loads the previous A/D conversion result, the controller 15 sets "1" to the least significant bit of the successive conversion register 14, and the DAC 12 generates the reference voltage VR in accordance with the value stored in the successive conversion register 14. In other word, it generates the reference voltage VR in the same manner as it generates the reference voltage VR in the conversion processing of the bit 0 in the first period.

When the DAC 12 generates the reference voltage VR, the comparator 13 compares the reference voltage VR with the voltage of the analog signal (for example, the analog signal AN0) selected by the selector 11.

If the voltage of the analog signal is equal to or greater than the reference value (voltage of the analog signal $\geq$ reference voltage VR), the comparator 13 sets the bit 0, the least significant bit of the successive conversion register 14, to "1". In contrast, if the voltage of the analog signal is less than the reference voltage VR (voltage of the analog signal<reference voltage VR), it sets the bit 0, the least significant bit of the successive conversion register 14, to "0".

After the conversion of the bit 0 is completed in this way, the controller 15 outputs the scanning cycle identification signal SCI indicating that the current A/D conversion (second one) is not the first A/D conversion so that the increment/decrement circuit 16 activates the command signal CM to increment or decrement the value stored in the successive conversion register 14. More specifically, the increment/decrement circuit 16 activates the command signal CM instructing to increment when "1" is stored in the least significant bit of the successive conversion register 14, the bit 0, and to decrement when "0" is stored in the bit 0.

When the increment/decrement circuit 16 activates the command signal CM instructing to increment, the operation circuit 17 reads the value stored in the successive conversion register 14 to increment it, and the conversion result storing register 18 stores its result. On the other hand, when the increment/decrement circuit 16 activates the command signal CM instructing to decrement, the operation circuit 17 reads the value stored in the successive conversion register 14 to decrement it, and the conversion result storing register 18 stores its result.

After completing the A/D conversion of the analog signal AN0, the converter carries out the A/D conversion of the analog signals AN1-Ann sequentially. The third and successive A/D conversion periods are carried out in the same manner as the second A/D conversion period.

Figure 2:
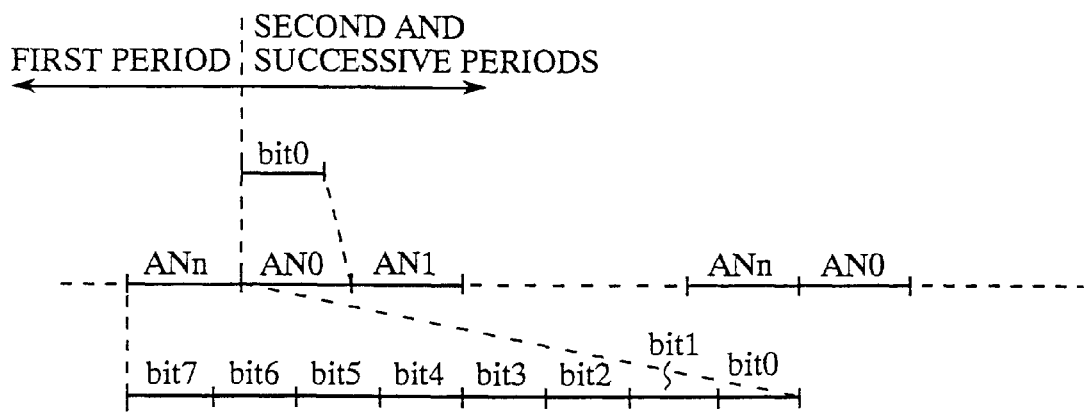
FIG. 2 is a time chart illustrating an operation of the A/D converter.

As described above, the present embodiment 1 is configured such that it carries out the A/D conversion of only the least significant bit of the previous A/D conversion result, and that if the least significant bit is converted to "1", it increments the A/D conversion result, whereas if the least significant bit is converted to "0", it decrements the A/D conversion result. This enables the converter to convert the analog signals into their corresponding digital signals by only converting the least significant bits without performing the full bit conversion after the second and successive periods as shown in FIG. 2. As a result, the present embodiment 1 has an advantage of being able to shorten the update period of the analog signals (it is reduced by a factor of eight in the 8-bit A/D converter, for example), and hence to increase the tracking ability of the digital signals to the variations of the analog signals.

Incidentally, since the present embodiment 1 increments or decrements the previous A/D conversion result without fail, the A/D conversion results change slightly even if the analog signals do not change, resulting in small errors (at the bit 0 level). The errors at the bit 0 level, however, are very small within an allowable range of the normal A/D converters.

Embodiment 2

Figure 3:
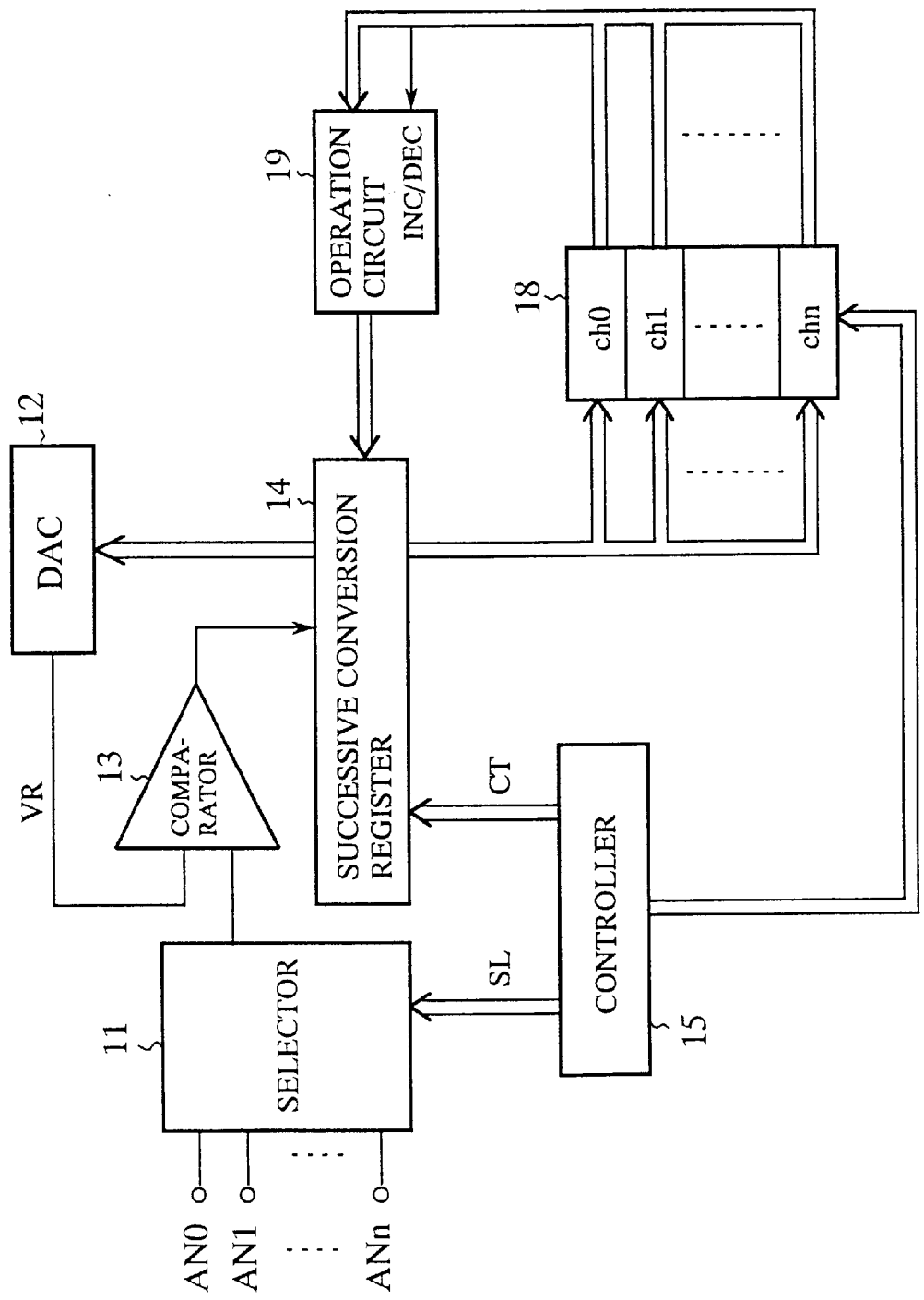
FIG. 3 is a block diagram showing an embodiment 2 of the A/D converter in accordance with the present invention.

FIG. 3 is a block diagram showing an embodiment 2 of the A/D converter in accordance with the present invention, in which the same reference numerals designate the same or like portions to those of FIG. 1, and the description thereof is omitted here.

The reference numeral 19 designates an operation circuit for incrementing the previous A/D conversion result if the bit 0, the least significant bit of that conversion result stored in the conversion result storing register 18 is "1", and for decrementing it if the bit 0 is "0".

Next, the operation of the present embodiment 2 will be described.

Although the foregoing embodiment 1 increments or decrements the A/D conversion result immediately after completing the conversion of the bit 0, an advantage similar to that of the embodiment 1 can be achieved by incrementing or decrementing the previous A/D conversion result immediately before the conversion of the bit 0, followed by the generation of the reference voltage in accordance with the conversion result, and by the conversion of the bit 0.

Embodiment 3

FIG. 4 is a block diagram showing an embodiment 3 of the A/D converter in accordance with the present invention, in which the same reference numerals designate the same or like portions to those of FIG. 1, and the description thereof is omitted here.

The reference numeral 20 designates a designation register for specifying the number of bits to be A/D converted; and 21 designates an increment/decrement circuit for activating a command signal to increment the value stored in the successive conversion register 14 if lowest few bits of the successive conversion register 14, which are specified by the designation register 20, are all "1", and for activating a command signal to decrement the value stored in the successive conversion register 14 if the lowest few bits are all "0".

Next, the operation of the present embodiment 3 will be described.

Although the foregoing embodiment 1 converts only the bit 0 in and after the second conversion period, the lowest few bits can be converted. More specifically, the number of bits to be subjected to the A/D conversion can be specified using the designation register 20. For example, when the lowest 3 bits are to be A/D converted, the designation register 20 is set to "3".

When the designation register 20 is set to "3", bit 2, bit 1 and bit 0 are converted in the second and successive periods in the same manner as they are converted in the first period, and then the increment/decrement circuit 21 checks, after the conversion of the three bits has been completed, whether the values of the bit 2, bit 1 and bit 0 are all "1" or not. If they are all "1", the increment/decrement circuit 21 activates the command signal to increment the value stored in the successive conversion register 14, and if they are all "0", the increment/decrement circuit 21 activates the command signal to decrement the value stored in the successive conversion register 14. Otherwise, that is, if "1" and "0" bits are mixed, the command signals to increment and decrement are made inactive.

The operation circuit 17 reads, when the increment/decrement circuit 21 activates the command signal to increment, the value stored in the successive conversion register 14 to increment it, and stores its result in the conversion result storing register 18. On the other hand, when the increment/decrement circuit 21 activates the command signal to decrement, the operation circuit 17 reads the value stored in the successive conversion register 14 to decrement it, and stores its result in the conversion result storing register 18. When the increment/decrement circuit 21 makes both the command signals inactive, the operation circuit 17 stores the value stored in the successive conversion register 14 into the conversion result storing register 18 without change.

Figure 5:
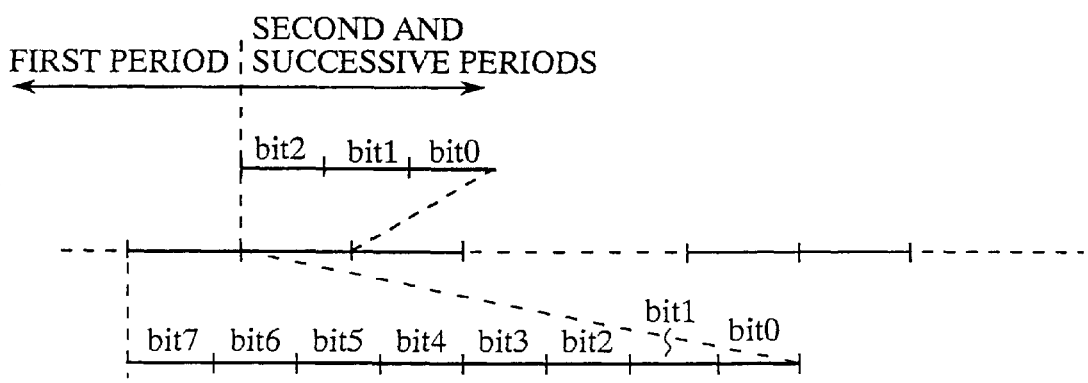
FIG. 5 is a time chart illustrating an operation of the A/D converter.

As described above, the present embodiment 3 is configured such that it carries out the A/D conversion of the lowest few bits of the previous A/D conversion result, and if all the lowest few bits are converted to "1", it increments the updated A/D conversion result, whereas if they are all converted to "0", it decrements the updated A/D conversion result. This enables the converter to convert the analog signals into their corresponding digital signals by only converting the lowest few bits without performing the full bit conversion in the second and successive periods as shown in FIG. 5. As a result, the present embodiment 3 has an advantage of being able to shorten the update period of the analog signals (update period of each analog signal is reduced by a factor of $3/8$ when the 8-bit A/D converter carries out 3 bit conversion, for example), and hence to increase the tracking ability of the digital signals to the variations of the analog signals.

In addition, the present embodiment 3 has an advantage over the foregoing embodiment 1 of being able to adjust the update period of the analog signals or the conversion accuracy of the A/D converter, considering the variation rates of the analog signals. Thus, it can offer an optimum A/D converter for individual systems.

Embodiment 4

Figure 6:
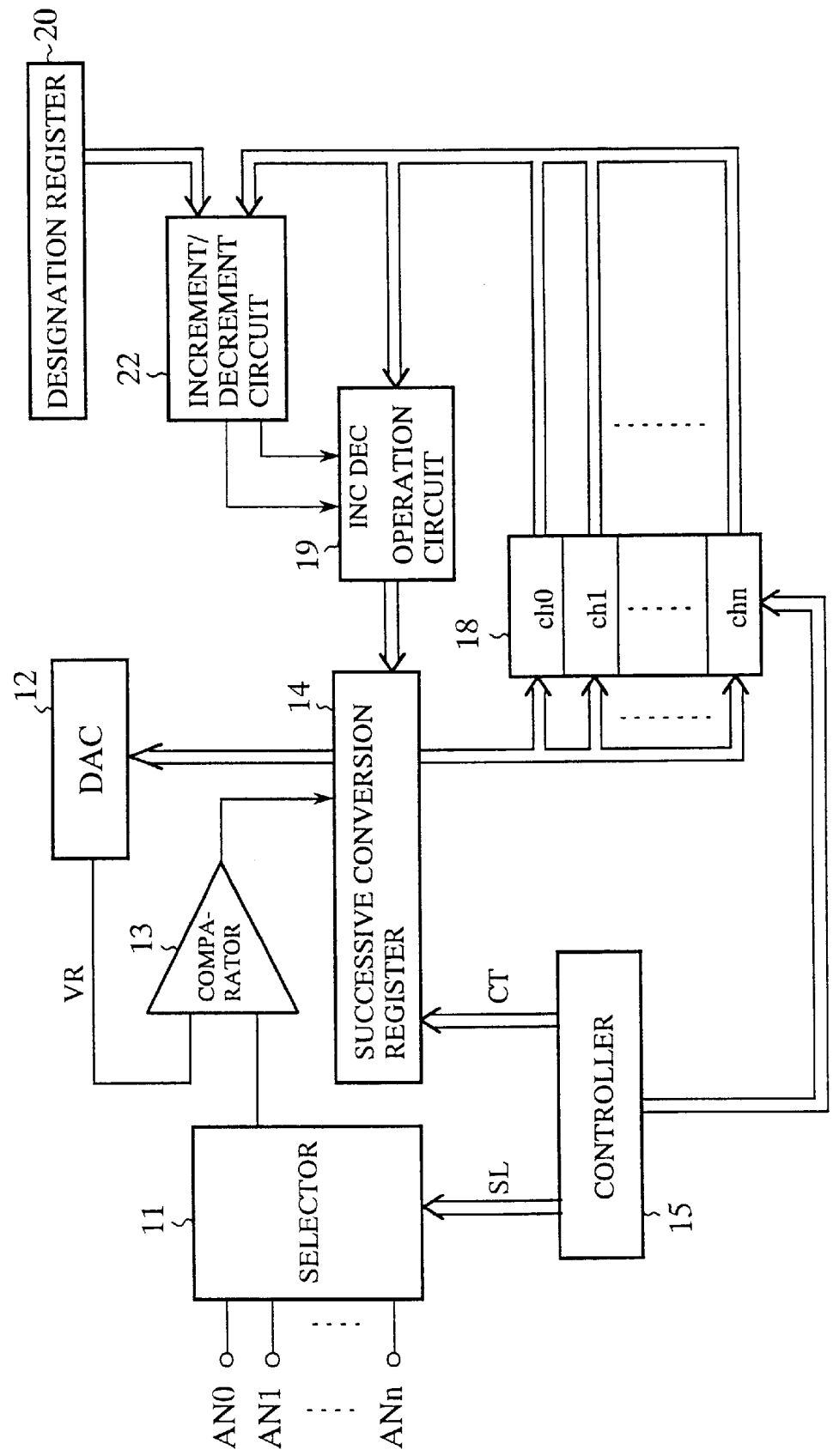
FIG. 6 is a block diagram showing an embodiment 4 of the A/D converter in accordance with the present invention.

FIG. 6 is a block diagram showing an embodiment 4 of the A/D converter in accordance with the present invention, in which the same reference numerals designate the same or like portions to those of FIG. 4, and the description thereof is omitted here.

The reference numeral 22 designates an increment/decrement circuit for incrementing the previous A/D conversion result if the lowest few bits of each previous A/D conversion result stored in the conversion result storing register 18, which are specified by the designation register 20, are all "1", and for decrementing the previous A/D conversion result if the lowest few bits are all "0".

Next, the operation of the present embodiment 3 will be described.

Although the foregoing embodiment 3 increments or decrements the A/D conversion result immediately after completing the conversion of the bit 2, bit 1 and bit 0, an advantage similar to that of the embodiment 3 can be achieved by incrementing or decrementing the previous A/D conversion result immediately before the conversion of the bit 2, bit 1 and bit 0, followed by the generation of the reference voltage in accordance with the conversion result, and by the conversion of the bit 2, bit 1 and bit 0.

More specifically, when the designation register 20 is set to "3", the increment/decrement circuit 22 checks whether the values of the bit 2, bit 1 and bit 0 of the previous A/D conversion result are all "1" or not. If they are all "1", the increment/decrement circuit 21 activates the command signal to increment the value stored in the conversion result storing register 18 when it is loaded into the successive conversion register 14, and if they are all "0", the increment/decrement circuit 21 activates the command signal to decrement the value stored in the conversion result storing register 18 when it is loaded into the successive conversion register 14. Otherwise, that is, if "1" and "0" bits are mixed, the command signals to increment and decrement are made inactive.

More specifically, the operation circuit 19 reads the value stored in the conversion result storing register 18, increments it when the increment/decrement circuit 22 activates the command signal to increment, and stores its result in the successive conversion register 14. On the other hand, when the increment/decrement circuit 22 activates the command signal to decrement, the operation circuit 19 decrements the value, and stores its result in the successive conversion register 14. When the increment/decrement circuit 22 makes both the command signals inactive, the operation circuit 19 loads the value stored in the conversion result storing register 18 into the successive conversion register 14 without change.

Embodiment 5

Figure 7:
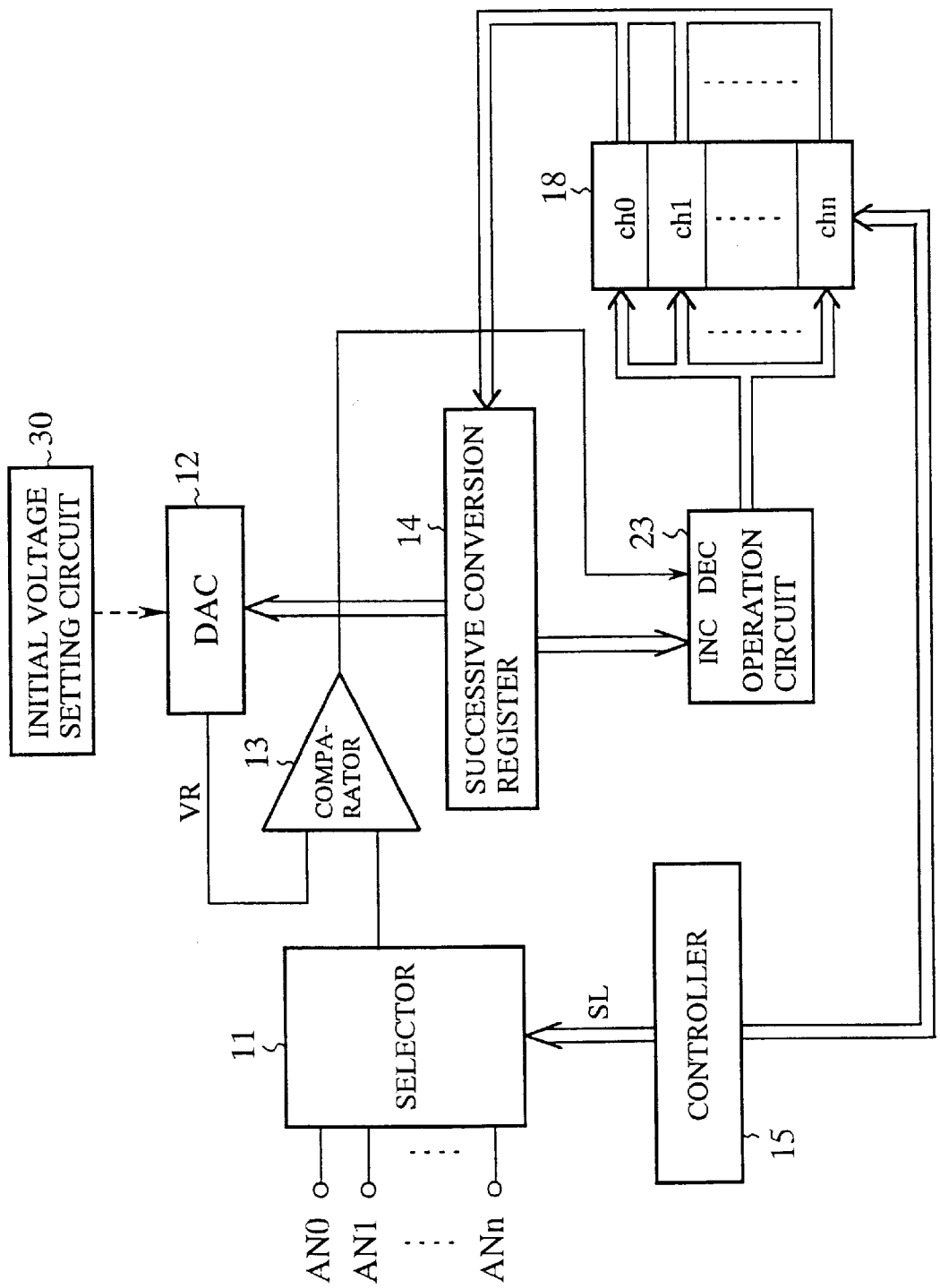
FIG. 7 is a block diagram showing an embodiment 5 of the A/D converter in accordance with the present invention.
Figure 8:
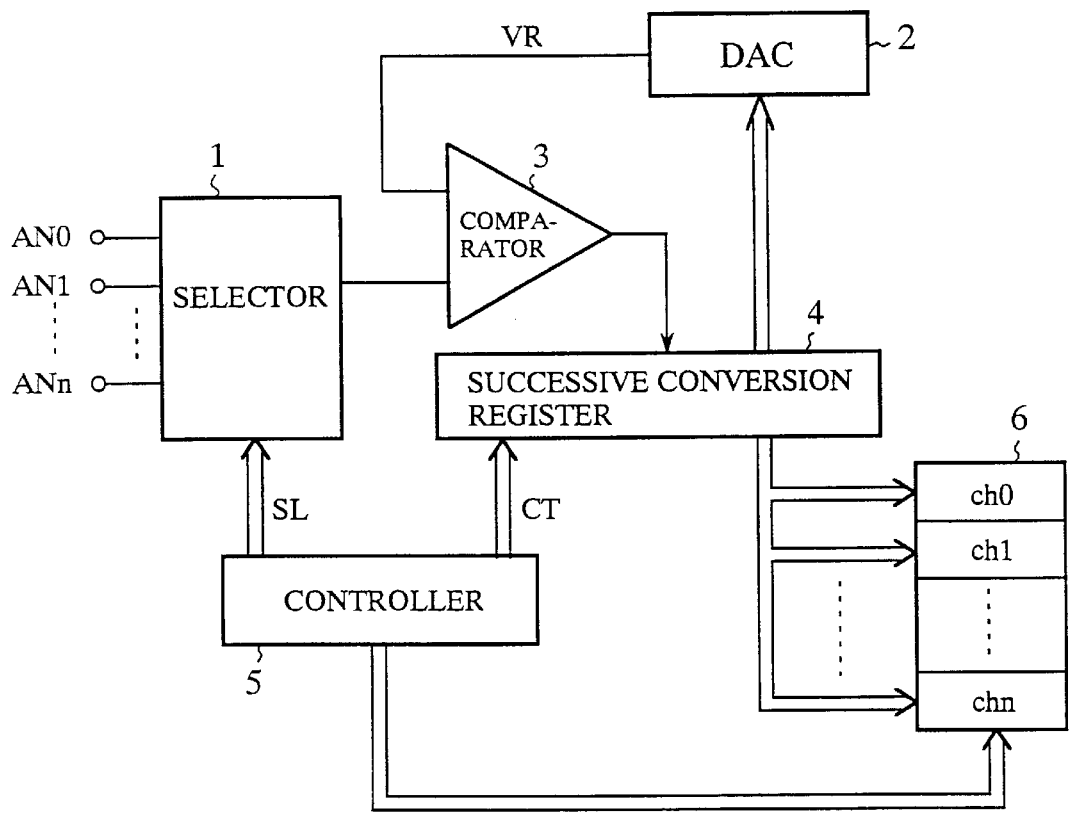
FIG. 8 is a block diagram showing a conventional A/D converter.
Figure 9:
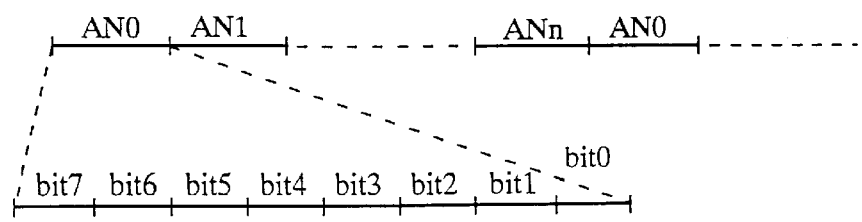
FIG. 9 is a time chart illustrating an operation of the conventional A/D converter.

FIG. 7 is a block diagram showing an embodiment 5 of the A/D converter in accordance with the present invention, in which the same reference numerals designate the same or like portions to those of FIG. 1, and the description thereof is omitted here.

The reference numeral 23 designates an increment/decrement circuit for incrementing the value stored in the successive conversion register 14 if the voltage of the analog signal is equal to or greater than the reference voltage, and for decrementing the value stored in the successive conversion register 14 if the voltage of the analog signal is less than the reference voltage.

Next, the operation of the present embodiment 5 will be described.

Although the foregoing embodiment 1 converts only the bit 0, the conversion of the bit can be omitted.

More specifically, the DAC 12 generates the reference voltage VR in accordance with the value stored in the successive conversion register 14 that stores the previous A/D conversion result, and the comparator 13 compares the reference voltage VR with the voltage of the analog signal.

If the voltage of the analog signal is equal to or greater than the reference voltage VR (voltage of the analog signal≧reference voltage VR), the operation circuit 23 reads the value stored in the successive conversion register 14 to increment it, and stores the result in the conversion result storing register 18. In contrast, if the voltage of the analog signal is less than the reference voltage VR (voltage of the analog signal<reference voltage VR), the operation circuit 23 reads the value stored in the successive conversion register 14 to decrement it, and stores the result in the conversion result storing register 18.

This enables the A/D converter to covert the analog signals to their corresponding digital signals without carrying out the full bit conversion, thereby reducing the update period of the analog signals. This offers an advantage of being able to improve the tracking ability of the digital signals to the variations of the analog signals.

Embodiment 6

Although the foregoing embodiments 1–5 carry out the full bit conversion in the first conversion period, the reference voltage can be initially set before performing the first A/D conversion period by providing an initial voltage setting circuit 30 as shown in FIG. 7. This offers an advantage of being able to convert the analog signals to the corresponding digital signals without carrying out the full bit conversion from the beginning of the first conversion period.

What is claimed is:

1. A successive approximation A/D converter for successively converting an analog signal to an N-bit digital signal on a bit by bit basis, where N is a positive integer, said successive approximation A/D converter comprising:

converting means for performing, at least for lowest M bits of the N-bit digital signal, where M is a positive integer less than N, successive A/D conversions of the analog signal by comparing a voltage of the analog signal with a reference voltage, and by updating, using a result of the comparison, a previous N-bit digital signal obtained as a result of a previous A/D conversion, thereby outputting a current N-bit digital signal;

generating means for generating the reference voltage corresponding to the previous N-bit digital signal; and operation means for incrementing the current N-bit digital signal output from said converting means if the lowest M bits of the current N-bit digital signal are all "1", and for decrementing the current N-bit digital signal output from said converting means if the lowest M bits of the current N-bit digital signal are all "0".

2. The successive approximation A/D converter as claimed in claim 1, wherein M is one, and said converting means compares the voltage of the analog signal with the reference voltage, and updates the least significant bit of the previous N-bit digital signal to "1" when the voltage of the analog signal is equal to or greater than the reference voltage, and to "0" when the voltage of the analog signal is less than the reference voltage, thereby outputting the current N-bit digital signal, and wherein said operation means increments, when said converting means converts the least significant bit to "1", the current N-bit digital signal output from said converting means, and decrements, when said converting means converts the least significant bit to "0", the current N-bit digital signal output from said converting means.

3. The successive approximation A/D converter as claimed in claim 1, further comprising designating means for specifying the integer M.

4. The successive approximation A/D converter as claimed in claim 1, wherein said converting means performs, only in a first one of the successive A/D conversions by said converting means, the A/D conversion for entire N bits of the N-bit digital signal.

5. The successive approximation A/D converter as claimed in claim 1, further comprising setting means for carrying out initial setting of the reference voltage when performing a first one of the successive A/D conversions by said converting means.

6. The successive approximation A/D converter as claimed in claim 1, further comprising a selector for selecting from among a plurality of analog signals the analog signal to be supplied to said converting means, and a memory for storing a plurality of N-bit digital signals obtained by A/D converting the plurality of analog signals.

7. A successive approximation A/D converter for successively converting an analog signal to an N-bit digital signal on a bit by bit basis, where N is a positive integer, said successive approximation A/D converter comprising:

operation means for incrementing a previous N-bit digital signal obtained as a result of a previous A/D conversion of the analog signal if lowest M bits of the previous N-bit digital signal are all "1", where M is a positive integer less than N, and for decrementing the previous N-bit digital signal if the lowest M bits of the previous N-bit digital signal are all "0", thereby outputting a modified previous N bit digital signal;

generating means for generating a reference voltage corresponding to the modified N-bit digital signal output from said operation means; and converting means for performing, at least for the lowest M bits of the N-bit digital signal, successive A/D conversions of the analog signal by comparing a voltage of the analog signal with the reference voltage, and for updating, using a result of the comparison, the modified previous N-bit digital signal output from said operation means.

8. The successive approximation A/D converter as claimed in claim 7, wherein M is one, and said operation means increments the previous N-bit digital signal when a least significant bit of the previous N-bit digital signal is "1", and decrements the previous N-bit digital signal when the least significant bit is "0", thereby outputting the modified previous N-bit digital signal, and wherein said converting means compares the voltage of the analog signal with the reference voltage, and updates the least significant bit of the modified previous N-bit digital signal output from said operation means to "1" when the voltage of the analog signal is equal to or greater than the reference voltage, and to "0" when the voltage of the analog signal is less than the reference voltage.

9. The successive approximation A/D converter as claimed in claim 7, further comprising designating means for specifying the integer M.

10. The successive approximation A/D converter as claimed in claim 7, wherein said converting means performs, only in a first one of the successive A/D conversions by said converting means, the A/D conversion for entire N bits of the N-bit digital signal.

11. The successive approximation A/D converter as claimed in claim 7, further comprising setting means for carrying out initial setting of the reference voltage when performing a first one of the successive A/D conversions by said converting means.

12. The successive approximation A/D converter as claimed in claim 7, further comprising a selector for selecting from among a plurality of analog signals the analog signal to be supplied to said converting means, and a memory for storing N-bit digital signals obtained by converting the plurality of analog signals.

13. A successive approximation A/D converter for successively converting an analog signal to an N-bit digital signal on a bit by bit basis, where N is a positive integer, said successive approximation A/D converter comprising:

generating means for generating a reference voltage corresponding to a previous N-bit digital signal obtained as a result of a previous A/D conversion of the analog signal; and converting means for carrying out successive A/D conversions of the analog signal by comparing a voltage of the analog signal with the reference voltage, by incrementing the previous N-bit digital signal when the voltage of the analog signal is equal to or greater than the reference voltage, and by decrementing the previous N-bit digital signal when the voltage of the analog signal is less than the reference voltage.

14. The successive approximation A/D converter as claimed in claim 13, wherein said converting means performs, only in a first one of the successive A/D conversions by said converting means, the A/D conversion for entire N bits of the N-bit digital signal.

15. The successive approximation A/D converter as claimed in claim 13, further comprising setting means for carrying out initial setting of the reference voltage when performing a first one of the successive A/D conversions by said converting means.

16. The successive approximation A/D converter as claimed in claim 13, further comprising a selector for selecting from among a plurality of analog signals the analog signal to be supplied to said converting means, and a memory for storing N-bit digital signals obtained by converting the plurality of analog signals.

* * * * *